June 17, 1969 O. H. GRANGAARD, JR 3,451,006

VARIABLE GAIN AMPLIFIERS

Filed May 29, 1967

INVENTOR.
ORRIN H. GRANGAARD, JR.
BY Charles J. Ungemach
ATTORNEY

United States Patent Office 3,451,006
Patented June 17, 1969

3,451,006

VARIABLE GAIN AMPLIFIERS

Orrin H. Grangaard, Jr., St. Paul, Minn., assignor to Honeywell Inc., Minneapolis, Minn., a corporation of Delaware Filed May 29, 1967, Ser. No. 641,750
Int. Cl. H03f 1/34
U.S. Cl. 330—69 5 Claims

ABSTRACT OF THE DISCLOSURE

An amplifier circuit having a gain which can be controlled to be either negative, zero, or positive. A differential amplifier is provided with a feedback circuit and a variable impedance input circuit; the gain of the amplifier circuit depends on the magnitude of the variable impedance with respect to the impedance of the feedback circuit.

*Background and description of the prior art*

The invention pertains to differential amplifiers with signal feedback. In prior art amplifier circuits the gain may be controlled to be zero or positive, or, alternately, zero or negative, but they normally are not capable of providing a gain which can be either positive or negative. The present invention pertains to an amplifier circuit which is capable of providing negative, zero, or positive gain. Although the invention is generally useful wherever an amplifier circuit is needed, it may be particularly useful In serving as a replacement for the rebalance or feedback potentiometer in a servo system. Therefore, it may be helpful to think of it as an electronic rebalance potentionmeter although its gain is not limited to unity or less than unity as an ordinary potentiometer is. Because the invention is an electronic system rather than a mechanical or electromechanical one, it is inherently more reliable.

*Summary*

The invention is an amplifier circuit which includes a differential amplifier having first and second input terminals and an output terminal. An input voltage is applied to a voltage divider network, in this case a pair of resistors in series, the output of which is supplied to the first input terminal of the differential amplifier. The input voltage is also applied to the second input terminal of the amplifier through a series inpedance, in this case a resistor. By adjusting the resistances of the voltage divider network and the series resistor, the magnitudes of the voltages at the first and second input terminals of the differential amplifier can be varied relative to each other. The second input terminal of the differential amplifier is also supplied with a feedback signal from a feedback network connected between the output and second input terminals of the differential amplifier. The resistance of the series resistor determines the overall gain of the circuit and also determines whether the gain is positive, zero, or negative. The gain is positive if the potential at the first input terminal of the amplifier is greater than that at the second input terminal, and conversely the gain is negative if the potential at the second input terminal of the amplifier is greater than that at the first input terminal. If both input terminals of the amplifier are at the same potential, the overall gain of the circuit is zero. The potential of the second input terminal of the amplifier with respect to the first input terminal is determined by the resistance of the variable resistor. If this resistance is made small, the second terminal is positive with respect to the first input terminal (assuming a positive input voltage); and if the resistance is large, the second input terminal is negative with respect to the first input terminal.

*Description of the preferred embodiments*

Figures 1, 2, 3, 4:
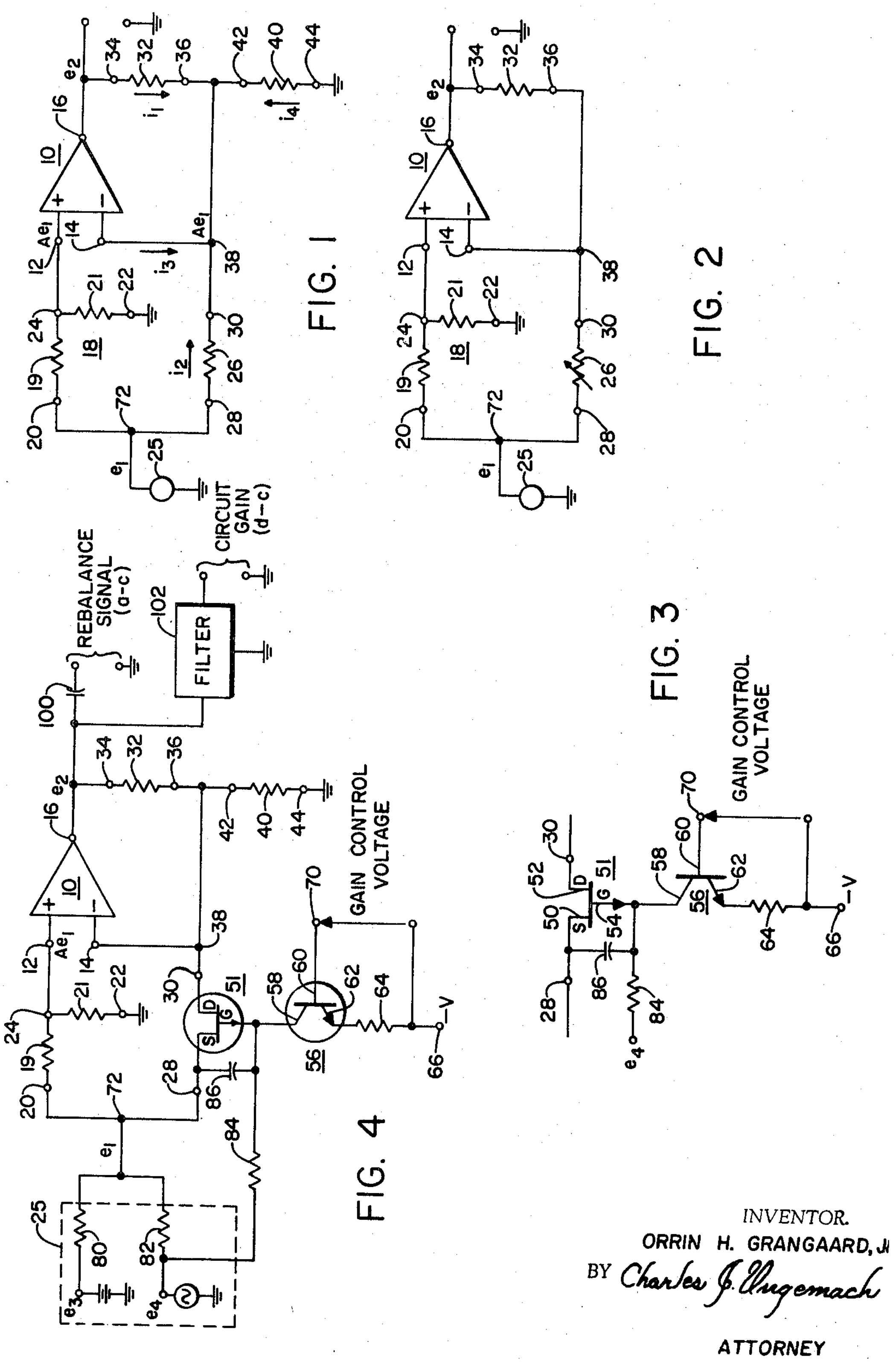
FIGURE 1 is a schematic diagram of the basic amplifying circuit.
FIGURE 2 is a schematic diagram of a modified version of the amplifying circuit of FIGURE 1.
FIGURE 3 is a schematic diagram of a voltage controlled resistance employing a field effect transistor.
FIGURE 4 is a schematic diagram of a system employing the basic amplifying circuit of FIGURE 1 and the voltage controlled resistance of FIGURE 3.

The amplifying circuit of FIGURE 1 employs a differential amplifier 10 having a first input terminal 12, a second input terminal 14, and an output terminal 16. Also included in the amplifying circuit is a voltage divider network 18 having input terminals 20 and 22 and an output terminal 24. The voltage divider 18 in this case, for example, comprises a pair of series resistors 19 and 21. A voltage $e_1$ provided by a supply 25 is applied across input terminals 20 and 22 of the voltage divider network 18. The output terminal 24 of divider network 18 is connected to the first input terminal 12 of differential amplifier 10. The voltage at terminal 24 is designated $Ae_1$, where A equals $R_{21}/R_{21}+R_{19}$. The voltage $e_1$ from supply 25 is also connected to the second input terminal 14 of differential amplifier 10 by an impedance element 26, for example, a resistor, connected between a pair of terminals 28 and 30. Terminal 38 is connected to voltage supply 25 and terminal 30 is connected to the second input terminal 14 of differential amplifier 10. Another voltage divider network comprising a series connected pair of impedances, for example, resistors 32 and 40, is connected to output terminal 16 of amplifier 10. Resistor 32 has terminals 34 and 36 with terminal 34 being connected to terminal 16 of amplifier 10. Resistor 40 has terminals 42 and 44 with terminal 44 being connected to ground and terminal 42 being connected to terminal 36 of resistor 32. The common junction point of resistors 32 and 40 is designated with the numeral 38 and this junction point is connected to input terminal 14 of amplifier 10. The voltage divider network comprised of resistors 32 and 40 provides a means for supplying a feedback signal from output terminal 16 of amplifier 10 to the second input terminal 14 of amplifier 10.

In analyzing the operation of the circuit of FIGURE 1, it will be assumed that four currents $i_1$, $i_2$, $i_3$, and $i_4$ flow into junction point 38. Current $i_1$ flows downward through resistor 32, current $i_2$ flows to the right in resistor 26, current $i_3$ flows downward from the second input terminal 14 of differential amplifier 10, and current $i_4$ flows upward in resistor 40. The algebraic sum of all electric currents flowing toward junction 38 is zero, therefore $$i_1+i_2+i_3+i_4=0$$

The input impedance looking into amplifier 10 from input terminal 14 is very high. Therefore the current flowing into terminal 14 to a very good approximation is equal to zero and $i_3=0$. The input impedance looking into amplifier 10 from terminal 12 is also extremely high and consequently no current or very little current flows into input terminal 12. The voltage at terminal 12 is $Ae_1$, where A is the factor introduced by voltage divider 18 and is equal to or less than 1 depending upon the size of the resistor 19 with respect to resistor 21. If resistor 19 is zero ohms then of course A is equal to 1 and the voltage at terminal 12 is $e_1$. It will be assumed that resistor 19 is not zero ohms and therefore A is less than 1. Under normal operating conditions with feedback between the output and input of amplifier 10 there is very little differential voltage between input terminals 12 and 14 of amplifier 10. That is, the voltage at terminal 14 is approximately equal to that at terminal 12 amplifier 10 is balanced, and the voltage at terminals 14 and 38 is equal to $Ae_1$. The currents $i_1$, $i_2$, and $i_4$ can be expressed in terms of $e_1$ and $e_2$, as follows:

$$i_1=(e_2-Ae_1)/R_{32}$$
$$i_2=(e_1-Ae_1)/R_{26}$$
$$i_4=-Ae_1/R_{40}$$

Substituting these current values into the equation $$i_1+i_2+i_3+i_4=0$$

(remembering that $i_3$ is about equal to zero) it can be shown that the transfer function $$e_2/e_1=A(1+R_{32}/R_{40})+(A-1)R_{32}/R_{26}$$

From examination it can be seen that $e_2/e_1$ can be made to be either positive, negative or zero, depending upon the ratio of $R_{32}$ to $R_{26}$. The second term on the right hand side of the equation is negative (because $A-1$ is negative), whereas the first term in the right hand side of the equation is positive. By adjusting the value of $R_{26}$ the second term can be made to have a magnitude greater than or less than that of the first term, and the equation can be made to the negative, positive, or zero. In this way the gain $e_2/e_1$ of the circuit can be varied.

The circuit of FIGURE 2 is identical to that of FIGURE 1 except for two changes. In FIGURE 2 the resistor 40 is removed. This means that $R_{40}$ goes to infinity in the transfer function equation and $$e_2/e_1-A+(A-1)R_{32}/R_{26}$$

The other change is that resistor 26 is made variable rather than being fixed as it is in FIGURE 1.

FIGURE 3 describes a circuit employing a field effect transistor which operates as a voltage controlled resistor and which may be substituted for the variable resistance 26 in FIGURE 2. In FIGURE 3 terminal 28 is connected to the source lead 50 of a field effect transistor 51. The drain lead 52 of transistor 51 is connected to terminal 30. The gate lead 54 of transistor 51 is connected to a collector lead 58 of a junction transistor 56. The base lead 60 of transistor 56 is connected to a terminal 70. The emitter lead 62 of transistor 60 is connected to a terminal 66 of a voltage source —V through a series resistor 64. The voltage present between terminal 66 and terminal 70 is designated the gain control voltage and its magnitude determines the collector current of transistor 56 and hence the source to gate voltage of field effect transistor 51. The voltage between the source lead and gate lead of transistor 51 determines the bias of transistor 51 which determines the resistance between terminals 28 and 30. Therefore by adjusting the voltage between terminals 66 and 70 the resistance between terminals 28 and 30 can be electronically adjusted or controlled. A capacitor 86 is connected across the source-gate junction of transistor 51 to bypass the source-gate junction with respect to A-C. Gate lead 54 is also connected through resistor 84 to a terminal of an A-C voltage source designated $e_4$.

FIGURE 4 is a schematic diagram of an eletronic system employing the basic amplifying circuit of FIGURE 1 and the voltage controlled resistance of FIGURE 3. In FIGURE 4 the voltage source 25 comprises a D-C source designated $e_3$ in series with a resistor 80 and an A-C source designated $e_4$ in series with a resistor 82. The right-hand ends of resistors 80 and 92 are tied together at a terminal 72 and the voltage present at terminal 72 is designated $e_1$ as before. This voltage has a D-C component contributed by source $e_3$ and an A-C component contributed by source $e_4$. Tied to the output terminal 16 of differential amplifier 10 is a D-C blocking capacitor 100. Capacitor 100 blocks the D-C signal present at terminal 16 and passes the A-C signal present there. Also connected to output terminal 16 of amplifier 10 is a filter 102 which acts to pass the D-C signal present at output terminal 16 and to block the A-C signal present there. The D-C signal at the output of filter 102 represents or is indicative of the circuit gain $e_2/e_1$ applied to the A-C signal $e_4$, passed by capacitor 100.

It should be obvious that impedance elements other than resistors can be used in the various voltage dividers and the feedback path. Although a preferred embodiment of the invention has been described it will be evident to those skilled in the art that modifications can be made which will not change the essential nature of the invention described in this specification. It is intended that this description be but an example of the invention and that the scope of the invention should not be limited thereto.

I claim:

1. A controlled gain amplifying circuit comprising:
- a differential amplifier having first and second input terminals and an output terminal;
- a first voltage divider network having input terminals for providing a supply of voltage to the network, and having an output terminal which is continuously connected to the first input terminal of the amplifier;
- an impedance element having an input terminal for providing the supply of voltage to the impedance element and having an output terminal which is continuously connected to the second input terminal of the amplifier; and
- a voltage divider network continuously connected between the output terminal of the differential amplifier and the second input terminal.

2. A controlled gain amplifying circuit comprising:
- a differential amplifier having first and second input terminals and an output terminal;
- a voltage divider network having input terminals for providing a supply of voltage to the network and having an output terminal which is continuously connected to the first input terminal of the amplifier;
- a variable impedance element having an input terminal for providing the supply of voltage to the impedance element and having an output terminal which is continuously connected to the second input terminal of the amplifier; and
- a second impedance element having first and second terminals, the first terminal connected to the output terminal of the amplifier and the second terminal continuously connected to the second input terminal of the amplifier.

3. A controlled gain amplifying circuit comprising:
- a differential amplifier having first and second input terminals and an output terminal;
- a voltage divider network having input terminals for providing a supply of voltage to the network and having an output terminal which is continuously connected to the first input terminal of the amplifier;
- a variable impedance element having an input terminal for providing the supply of voltage to the variable impedance element and having an output terminal which is connected to the second input terminal of the amplifier; and
- means for continuously supplying a feedback signal from the output terminal of the amplifier to the second input terminal thereof.

4. A controlled gain amplifying circuit comprising:
- a differential amplifier having first and second input terminals and an output terminal;
- a voltage divider network having input terminals for providing a single supply of voltage to the network and having an output terminal which is continuously connected to the first input terminal of the amplifier;
- means for providing a variable impedance current path, which is continuously connected between the supply of voltage and the second input terminal of the amplifier; and
- means for continuously supplying a feedback signal from the output terminal of the differential amplifier to the second input terminal thereof.

5. The apparatus of claim 4 wherein the supply of voltage is an A-C voltage superimposed on a D-C voltage, a D-C blocking capacitor is connected to the output terminal of the amplifier to separate the D-C component of a signal present at the output terminal from its A-C component, and a filter is connected to the output terminal of the amplifier to remove the D-C component of a signal at the output terminal of the amplifier, said D-C component being indicative of the gain of the circuit.

References Cited

UNITED STATES PATENTS

| | | | |
|---|---|---|---|
| 2,846,522 | 8/1958 | Brown | 330—69 X |
| 3,005,164 | 10/1961 | Newbold | 330—108 |

| | | | |
|---|---|---|---|
| 3,260,955 | 7/1966 | Offner | 330—30 X |

OTHER REFERENCES

Todd, "Fets as Voltage-Variable Resistors," Electronic Design, vol. 13, No. 19, Sept. 9, 1965, pp. 66–69.

JOHN KOMINSKI, *Primary Examiner.*

JAMES B. MULLINS, *Assistant Examiner.*

U.S. Cl. X.R.

330—28, 29, 108, 145, 30